United States Patent
Choi

(12) 
(10) Patent No.: US 6,503,787 B1
(45) Date of Patent: Jan. 7, 2003

(54) DEVICE AND METHOD FOR FORMING SEMICONDUCTOR INTERCONNECTIONS IN AN INTEGRATED CIRCUIT SUBSTRATE

(75) Inventor: Seungmoo Choi, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/631,546

(22) Filed: Aug. 3, 2000

Related U.S. Application Data

(62) Division of application No. 09/150,529, filed on Sep. 10, 1998.

(51) Int. Cl.$^7$ ............................................. H01L 21/8238
(52) U.S. Cl. ...................... 438/214; 438/227; 438/228; 438/280; 257/368; 257/369
(58) Field of Search ................................ 438/199, 214, 438/227, 228, 280, 322, 529, 526; 257/368, 369, 401, 621, 758, 773

(56) References Cited

U.S. PATENT DOCUMENTS

| | | | |
|---|---|---|---|
| 4,317,273 A | * | 3/1982 | Guterman et al. ............. 29/571 |
| 4,892,840 A | * | 1/1990 | Esquivel et al. .............. 437/52 |
| 5,283,454 A | | 2/1994 | Cambou |
| 5,384,475 A | | 1/1995 | Yahata |
| 5,666,002 A | * | 9/1997 | Yamamoto et al. ......... 257/621 |
| 6,268,248 B1 | * | 7/2001 | Mehrad ...................... 438/262 |

* cited by examiner

*Primary Examiner*—Steven Loke
*Assistant Examiner*—Donghee Kang

(57) ABSTRACT

The present invention provides a semiconductor device, formed on a semiconductor wafer, comprising a tub, first and second active areas, and an interconnect. In one aspect of the present invention, the tub is formed in the substrate of the semiconductor wafer and first and second active areas are in contact with the tub. In one advantageous embodiment, the interconnect is formed in the tub and is in electrical contact with the first and second active areas. The interconnect extends from the first active area to the second active area to electrically connect the first and second active areas.

8 Claims, 3 Drawing Sheets

DEVICE AND METHOD FOR FORMING SEMICONDUCTOR INTERCONNECTIONS IN AN INTEGRATED CIRCUIT SUBSTRATE

TECHNICAL FIELD OF THE INVENTION

This Application is a Divisional of prior Application Ser. No. 09/150,529 filed on Sep. 10, 1998, currently pending, to Seungmoo Choi. The above-listed Application is commonly assigned with the present invention and is incorporated herein by reference as if reproduced herein in its entirety under Rule 1.53(b).

The present invention is directed, in general, to a device and method for forming a semiconductor device local interconnect and, more specifically, to a method of forming an interconnect within a semiconductor tub.

BACKGROUND OF THE INVENTION

Much attention is given to certain aspects of integrated circuit (IC) technology, such as the number or dimensions of the devices in the circuit and circuit processing speeds that can reach millions of instructions per second (MIPS). Clearly, progress in these areas has great appeal and is readily understood. However, there are other aspects of very large scale integrated (VLSI) circuit technology that are of significant importance. For example, the various devices, e.g., sources, gates and drains, of the integrated circuits must be electrically connected to be of any use within a larger electrical circuit. In the prior art, active devices have been successfully connected by depositing patterned metal, usually aluminum but more recently copper, in one or more layers above the device layers. To interconnect the appropriate devices and metal layers, metal plugs, typically tungsten (W) are formed through the dielectric layers and between the different metal layers. Significantly, the metal layering process is much more expensive than other processes such as ion implantation. The methods for defining and forming such patterned metal layers, tungsten plugs, and dielectric layers are well known to those who are skilled in the art.

Market demands for faster and more powerful integrated circuits have resulted in significant growth in the number of devices per $cm^2$, i.e., a higher packing fraction of active devices. This increased packing fraction invariably means that the interconnections for ever-more-complicated circuits are made to smaller dimensions than before. However, as device sizes reach 0.25 μm and below, physical limitations of the metal deposition processes prevent reducing the scale of the device interconnections at the same rate as the devices.

Accordingly, what is needed in the art is a method for forming semiconductor device interconnections that is more cost effective and is not size limited as in the prior art. The present invention addresses this need.

SUMMARY OF THE INVENTION

To address the above-discussed deficiencies of the prior art, the present invention provides a semiconductor device, formed on a semiconductor wafer, comprising a tub, first and second active areas, and an interconnect. In one aspect of the present invention, the tub is formed in the substrate of the semiconductor wafer with the first and second active areas in contact with the tub. In one advantageous embodiment, the interconnect is formed in the tub and is in electrical contact with the first and second active areas. The interconnect extends from the first active area to the second active area to electrically connect the first and second active areas.

Thus, the present invention provides an interconnect that uses the tub region for device electrical connections. Because of the unique location of the interconnect, device space above the tub region is better utilized to allow for a higher packing fraction.

In one embodiment, the interconnect comprises an implanted pattern formed in the tub and that extends into the first and second active areas. The first and second active areas may be source or drain regions and in some embodiments may include gates.

In another aspect of the present invention, the tub is a p-tub or an n-tub.

In another embodiment, the semiconductor device further comprises a gate, a third active area, and a field oxide. The third active area is not in contact with the interconnect, and the field oxide is formed between the second and third active areas. In one aspect of this embodiment, the gate contacts the first and third active areas.

In yet another embodiment, the semiconductor device further comprises a second gate in contact with the second active area. In an alternative embodiment, the semiconductor device further comprises a dielectric formed over the gate, the field oxide, and the first, second and third active areas. In one aspect, the dielectric has dummy plugs formed over the first and second active areas and in contact with the interconnect.

In still another embodiment, the semiconductor device further comprises a dielectric formed over the first and second active areas. The dielectric has conductive dummy plugs that are formed over the first and second active areas and that are in contact with the interconnect. In one aspect of the present invention, the interconnect is electrically connected to a current source. In another aspect, the semiconductor device may be a DRAM device, a FLASH device, a ROM device, or an SRAM device.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
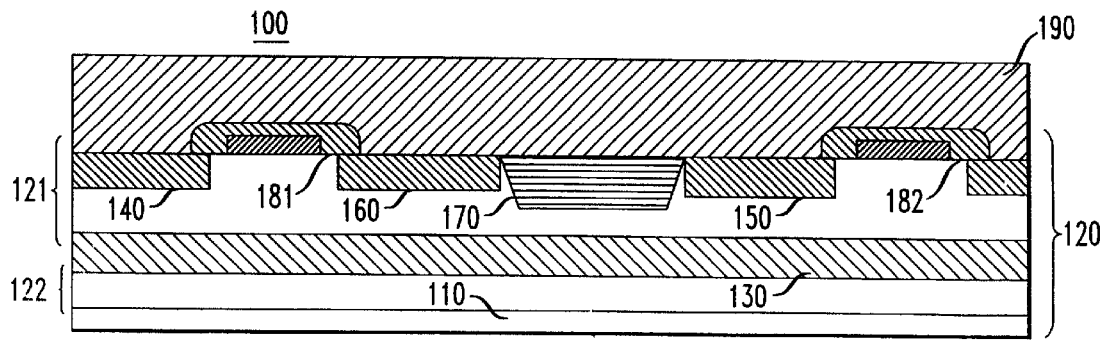
FIG. 1 illustrates a sectional view of a portion of an n-channel memory device at an intermediate stage of manufacture constructed according to the principles of the present invention.

Referring initially to FIG. 1, illustrated is a sectional view of a portion of an n-channel memory device at an intermediate stage of manufacture constructed according to the principles of the present invention. An n-channel memory device 100 comprises a silicon substrate 110, a p-tub 120, an interconnect layer 130 constructed in accordance with the present invention, a first source region 140, a second source region 150, a drain region 160, a field oxide region 170, a first gate oxide 181, a second gate oxide 182, and a dielectric layer 190. In one embodiment, the p-tub 120 is formed conventionally in the silicon substrate 110 by implanting with boron. The p-tub 120 may be considered to comprise an upper p-tub region 121, and a lower p-tub region 122. During p-tub 120 formation, the interconnect layer 130 is formed by patterning and implanting the p-tub with an n-type dopant, such as phosphorus or arsenic. Effectively, the interconnect layer 130 is embedded, or buried, in the p-tub 120. However, since the interconnect layer 130 is buried in the p-tub 120 and is not a solid layer, the upper p-tub region 121 is not electrically isolated from the lower p-tub region 122. As the interconnect layer 130 occupies a relatively large area of the p-tub, it is not necessary to use critical optical lithography for definition of the buried interconnect layer 130. After the p-tub 120 and interconnect layer 130 are formed, the first and second source regions 140, 150 and the drain region 160 are formed by conventional processes. One who is skilled in the art is familiar with the conventional processes used to form p-tubs, as well as source and drain regions. The use of the present invention in p-channel devices employing an n-tub is also anticipated as well as other dopant schemes that are applicable to such semiconductor devices.

Figure 2:
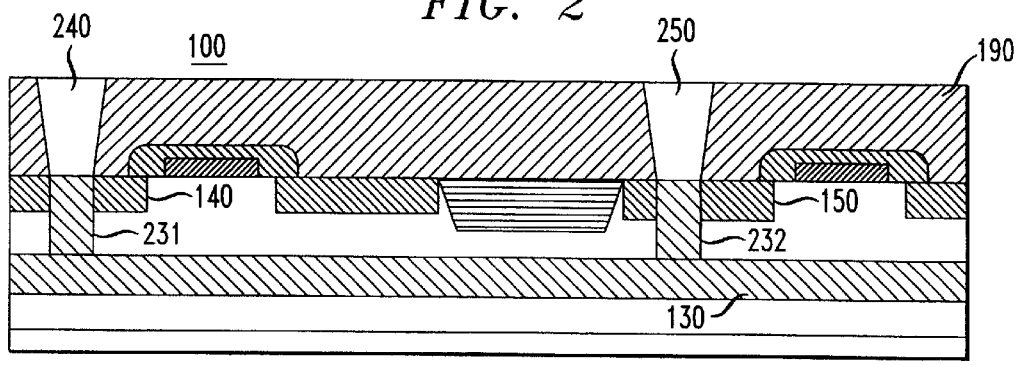
FIG. 2 illustrates a sectional view of the n-channel memory device of FIG. 1 at a subsequent stage of manufacture.

Referring now to FIG. 2, illustrated is a sectional view of the n-channel memory device of FIG. 1 at a subsequent stage of manufacture. The dielectric 190 has been patterned with openings 240, 250 to expose a portion of the first and second source regions 140, 150 respectively. A high energy beam of n-dopant may now be used to create implanted plugs 231, 232 thereby forming connections between the interconnect layer 130 and the first and second source regions 140, 150. One who is skilled in the art will recognize that the basics of the patterning and energy implantation techniques described are conventional with the exception, of course, of the formation of the implanted plugs.

Figure 3:
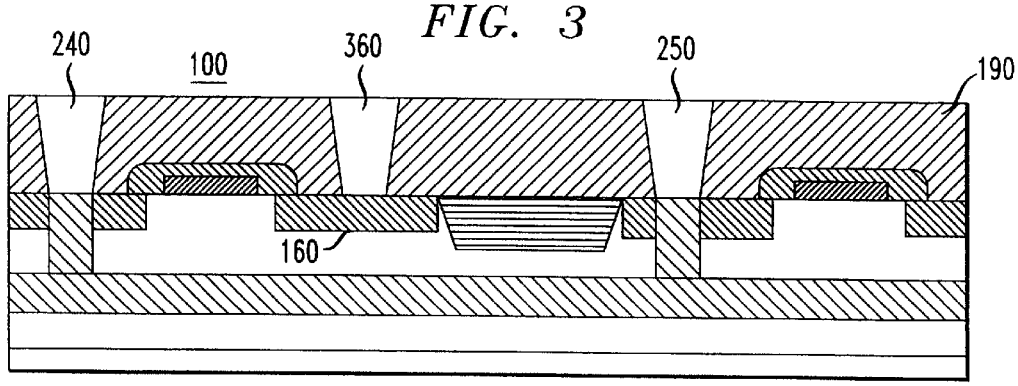
FIG. 3 illustrates a sectional view of the n-channel memory device of FIG. 2 after further patterning.

Referring now to FIG. 3, illustrated is a sectional view of the n-channel memory device of FIG. 2 after further patterning.

The dielectric 190 has now been patterned with an opening 360 to expose a portion of the drain region 160.

Figure 4:
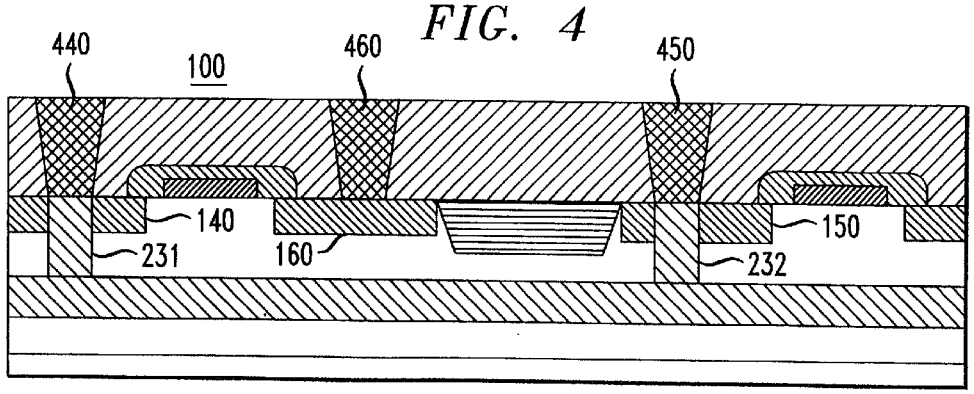
FIG. 4 illustrates a sectional view of the n-channel memory device of FIG. 3 after the deposition of a conductive material.

Referring now to FIG. 4 with continuing reference to FIG. 3, illustrated is a sectional view of the n-channel memory device of FIG. 3 after the deposition of a conductive material, such as tungsten. Conductive plugs 440, 450, 460 are deposited using conventional techniques to fill the openings 240, 250, 360, respectively. While the conductive material deposition is conventional, the intended use of the plugs are not necessarily so. Conductive plug 460 will ultimately provide a conventional contact for drain region 160. However, conductive plugs 440, 450 are dummy plugs, which are not to be used for contacting other parts of the semiconductor, but rather are simply used to fill the openings 240, 250 remaining after the formation of the implanted plugs 231, 232. Further connection of the first and second source regions 140, 150 to other parts of the semiconductor will be accomplished by connecting to the interconnect layer 130 through a connection not shown. While the illustrated embodiment details the interconnect being formed between first and second source regions, one who is skilled in the art will recognize that the present invention may also be used to interconnect drain regions.

Figure 5A:
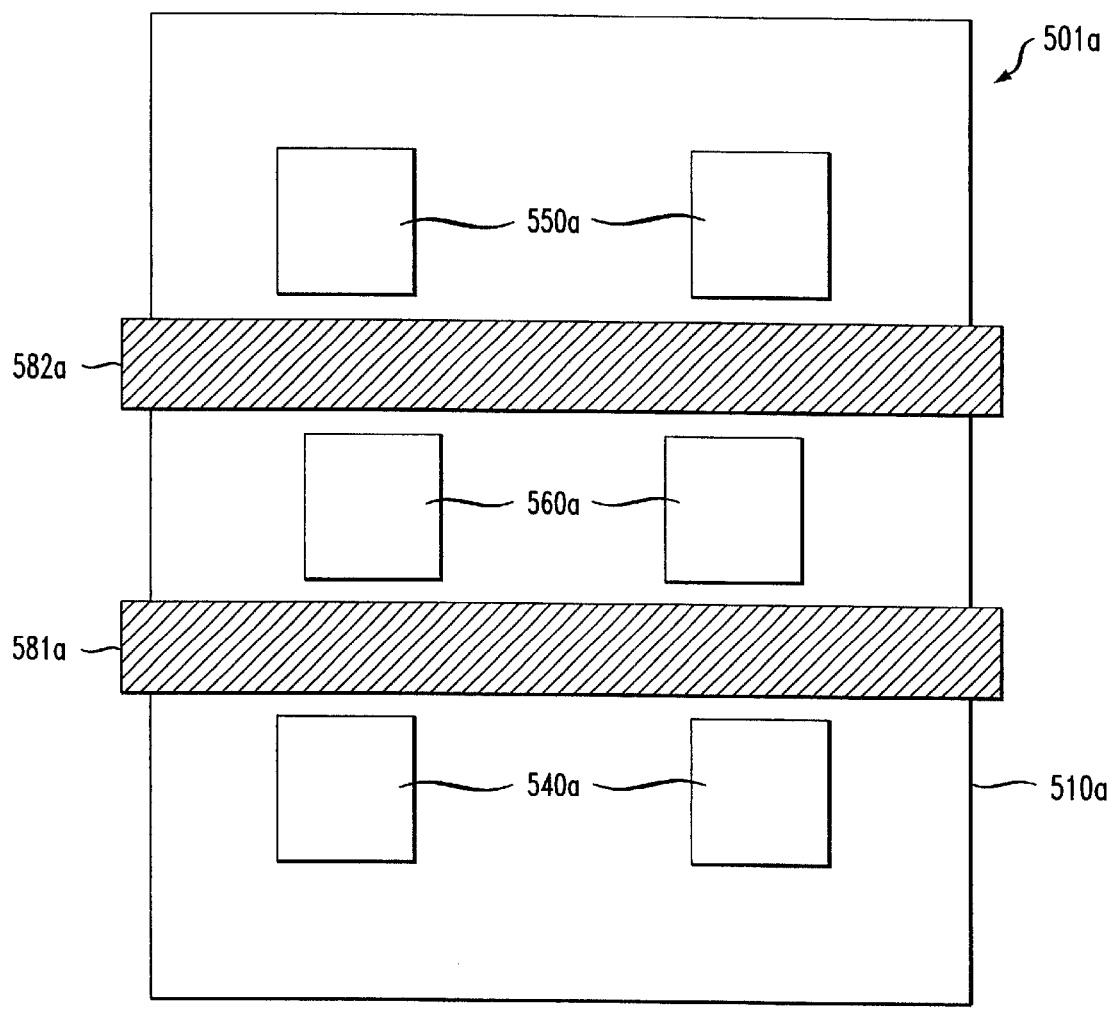
FIG. 5A illustrates a plan view of a conventional n-channel memory cell.

Referring now to FIG. 5A, illustrated is a plan view of a conventional n-channel memory cell. Essential elements of a conventional n-channel memory cell 501a, which are visible in this view, may comprise a plurality of first source regions 540a, a plurality of second source regions 550a, and a plurality of drain regions 560a. Also shown are polysilicon or polycide gates 581a and 582a. In the illustrated embodiment, the memory cell 501a has been optimized for minimal size using available prior art techniques. The memory cell area is defined by a square perimeter 510a that measures 2.44 $\mu$m on a side. Thus, the cell area is equal to 5.95 $\mu m^2$.

Figure 5B:
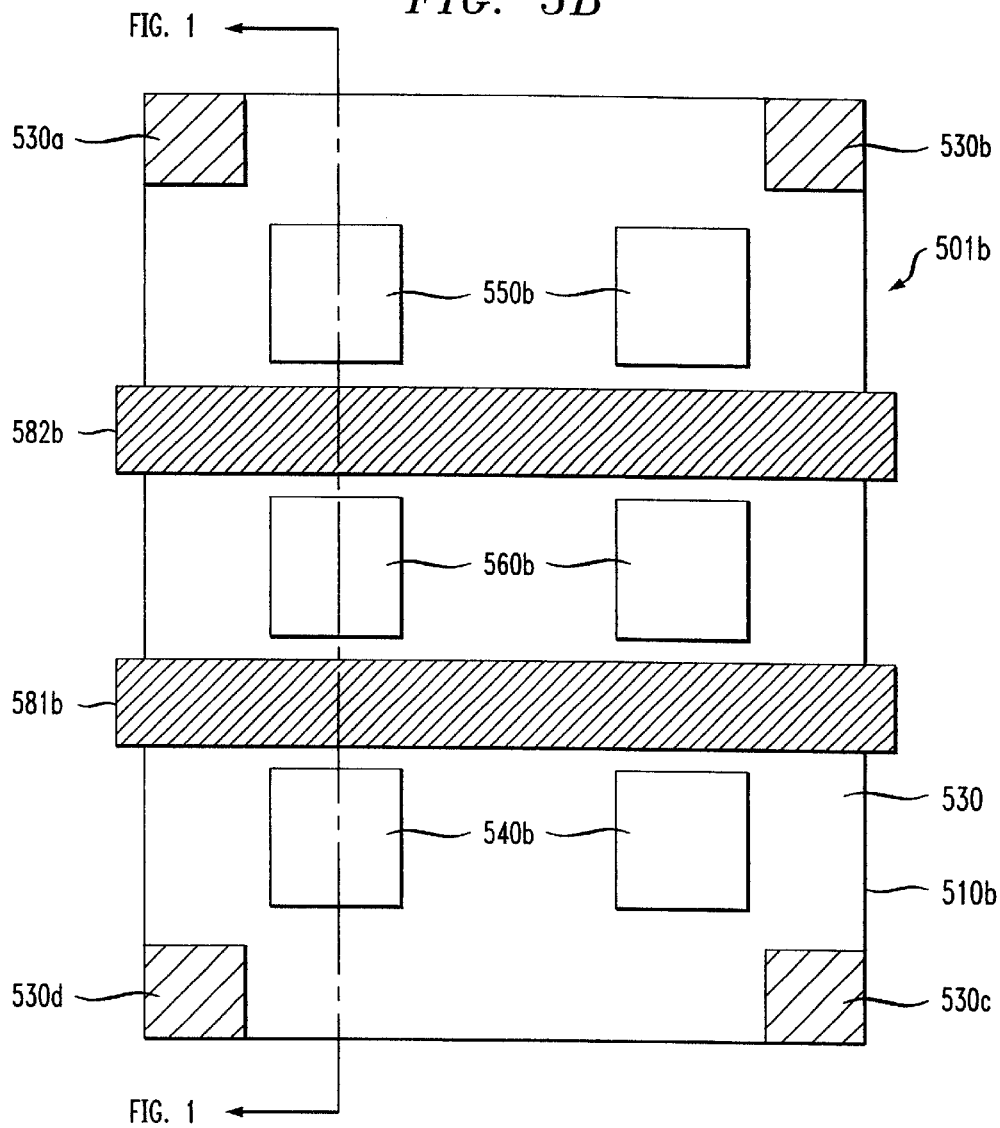
FIG. 5B illustrates a plan view of an n-channel memory cell constructed according to the principles of the present invention.

Referring now to FIG. 5B with continuing reference to FIGS. 1 and 5A, illustrated is a plan view of an n-channel memory cell constructed according to the principles of the present invention. For reference, FIG. 1 is representative of a sectional view of memory cell 501b along plane 1—1. Components of a memory cell 501b of the present invention analogous to components of the conventional memory cell 510a are correspondingly identified as: first source regions 540b, second source regions 550b, drain regions 560b, and polysilicon gates 581b and 582b. Additionally shown is an interconnect layer 530. It should be noted that the planform of the interconnect layer 530 may be identified as a dodecagon. The dodecagon 530 may be seen as coincident with a cell perimeter 510b except at corners 530a–530d. It is through these corners 530a–530d, where the interconnect layer 530 is not present, that electrical connectivity between the upper and lower p-tubs 121, 122 is maintained. In the illustrated embodiment, the memory cell area may be defined by the rectangular perimeter 510b that measures 1.84 $\mu$m by 2.36 $\mu$m. Therefore, the cell area for a comparable memory cell of the present invention is equal to 4.34 $\mu m^2$. Significantly, memory cell area for comparable function has been reduced by more than 27 percent while employing a more cost effective manufacturing technique than metal layering. Of course, it should be understood that other layout patterns of the interconnect 530 may also be employed.

Figure 6:
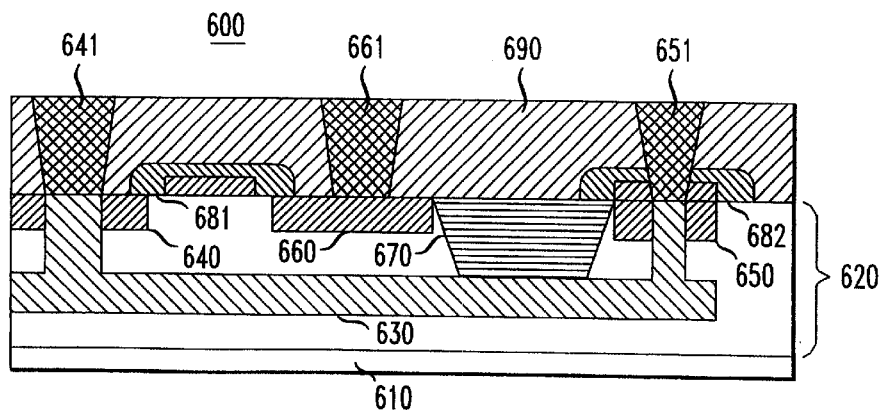
FIG. 6 illustrates a sectional view of one embodiment of an SRAM device constructed according to the principles of the present invention.

Referring now to FIG. 6, illustrated is a sectional view of one embodiment of an SRAM device constructed according to the principles of the present invention. A static random access memory (SRAM) device 600 comprises a silicon substrate 610, a p-tub 620, an interconnect layer 630, a source region 640, a merged contact region 650, a drain region 660, a field oxide region 670, a first gate oxide 681, a second gate oxide 682, and a dielectric layer 690. Conductive plugs 641, 651, and 661 are formed as previously described. As in previously described embodiments, conductive plugs 641, 651 are dummy plugs. The processes used for the formation of the p-tub 620, interconnect layer 630 and other components of the SRAM device are analogous to their counterparts of the n-channel memory cell previously described. One who is skilled in the art is familiar with the conventional processes used to form the various components of an SRAM. A conventional SRAM design, as shown, has been optimized to an area of 4.90 $\mu m^2$. An SRAM constructed according to the principles of the present invention has been sized to an area of 4.32 $\mu m^2$, a reduction of almost 12 percent. It is anticipated that the SRAM cell area may be further reduced by applying the present invention to interconnect the drains as well as the sources of the SRAM. Thus it can be seen that the present invention has broad applicability to the manufacture of many different types of semiconductor devices.

Although the present invention has been described in detail, those skilled in the art should understand that they can make various changes, substitutions and alterations herein without departing from the spirit and scope of the invention in its broadest form.

What is claimed is:

1. A method for forming a semiconductor device on a semiconductor wafer, comprising:

forming a first tub in a substrate of said semiconductor wafer;

forming a second tub in said substrate of semiconductor wafer;

fabricating source/drain regions located in said first and second tubs;

forming an interconnect in said first and second tubs; and forming contact plugs through said source/drain regions and extending to said interconnect to electrically connect said source/drain regions.

2. The method as recited in claim 1 wherein forming an interconnect includes patterning said interconnect and implanting said interconnect within said first and second tubs.

3. The method as recited in claim 1 wherein forming an interconnect includes forming said interconnect in at least a portion of said source/drain regions.

4. The method as recited in claim 1 wherein fabricating said source/drain regions includes fabricating first and second source regions or first and second drain regions.

5. The method as recited in claim 1 wherein forming a first or second tub includes forming a first or second p-tub, respectively.

6. The method as recited in claim 1 wherein forming a first or second tub includes forming a first or second n-tub, respectively.

7. The method as recited in claim 1 wherein forming an interconnect includes:

depositing a dielectric over said source/drain regions;

forming openings in said dielectric over said source/drain regions;

implanting an interconnect dopant in at least a portion of said source/drain regions by way of said openings to form implanted plugs within said first or second tub that contact said interconnect; and forming conductive dummy plugs in said openings to contact said implanted plugs.

8. The method as recited in claim 1 wherein forming a semiconductor device includes selecting from the group consisting of: a DRAM device, a FLASH device, a ROM device and a SRAM device.

* * * * *